(12) United States Patent
Yokoi et al.

(10) Patent No.: US 9,913,404 B2
(45) Date of Patent: Mar. 6, 2018

(54) COOLING APPARATUS

(71) Applicant: MITSUBISHI ELECTRIC CORPORATION, Chiyoda-ku, Tokyo (JP)

(72) Inventors: Masahiro Yokoi, Tokyo (JP); Yoshiyuki Deguchi, Tokyo (JP); Katsuhisa Kodama, Tokyo (JP); Yusuke Nakanishi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/303,392

(22) PCT Filed: Jun. 12, 2015

(86) PCT No.: PCT/JP2015/067044
§ 371 (c)(1),
(2) Date: Oct. 11, 2016

(87) PCT Pub. No.: WO2015/198893
PCT Pub. Date: Dec. 30, 2015

(65) Prior Publication Data
US 2017/0034949 A1   Feb. 2, 2017

(30) Foreign Application Priority Data

Jun. 24, 2014 (JP) ................. 2014-128820

(51) Int. Cl.
*H05K 7/20* (2006.01)
*H01L 23/473* (2006.01)

(52) U.S. Cl.
CPC ....... *H05K 7/20254* (2013.01); *H01L 23/473* (2013.01)

(58) Field of Classification Search
CPC .......................... H05K 7/20254; H01L 23/473
(Continued)

(56) References Cited

U.S. PATENT DOCUMENTS

| 7,717,568 | B2* | 5/2010 | Fujimori | B21D 53/08 |
| | | | | 29/890.035 |
| 2013/0114210 | A1* | 5/2013 | Ebersberger | H01L 23/473 |
| | | | | 361/702 |

(Continued)

FOREIGN PATENT DOCUMENTS

| JP | H-2-28965 | | 2/1990 | |
| JP | H0228965 U | * | 2/1999 | ............. F28D 1/047 |

(Continued)

OTHER PUBLICATIONS

International Search Report (PCT/ISA/210) dated Sep. 15, 2015, by the Japanese Patent Office as the International Searching Authority for International Application No. PCT/JP2015/067044.

(Continued)

*Primary Examiner* — Anthony Haughton
*Assistant Examiner* — Yahya Ahmad
(74) *Attorney, Agent, or Firm* — Buchanan Ingersoll & Rooney PC

(57) ABSTRACT

A cooling apparatus has: an opening formed in a cooling plate for cooling an electronic component; and an electronic component accommodating section formed in the opening. A cooling pipeline is disposed in a manner to surround an outer side surface section of the electronic component accommodating section, whereby the electronic component and the cooling pipeline are arranged at substantially the same height as a top of the cooling plate to realize a low profile. In addition, the electronic component accommodating section, which is joined to the cooling plate, is configured that a side surface section thereof is in contact with a (Continued)

side surface section of the electronic component via a potting material. In this way, an area that contributes to heat radiation is increased.

13 Claims, 9 Drawing Sheets

(58) Field of Classification Search
USPC ............... 361/679.52–679.54, 698–702, 711
See application file for complete search history.

(56) References Cited

U.S. PATENT DOCUMENTS

| | | | |
|---|---|---|---|
| 2013/0228322 A1* | 9/2013 | Yasuda ................ | B23K 1/0012 165/185 |
| 2016/0105998 A1* | 4/2016 | Lodholz ............. | H05K 7/20254 361/698 |
| 2016/0150678 A1* | 5/2016 | Kim ................... | H05K 7/20636 361/699 |
| 2017/0027081 A1* | 1/2017 | Zhang ................ | H05K 7/20272 |

FOREIGN PATENT DOCUMENTS

| | | | | |
|---|---|---|---|---|
| JP | 2009-99995 A | | 5/2009 | |
| JP | 2009099995 A | * | 5/2009 | ..... H01L 2924/0002 |
| WO | WO 2014/080462 A1 | | 5/2014 | |
| WO | WO 2014080462 A1 | * | 5/2014 | ............. H01F 37/00 |

OTHER PUBLICATIONS

Written Opinion (PCT/ISA/237) dated Sep. 15, 2015, by the Japanese Patent Office as the International Searching Authority for International Application No. PCT/JP2015/067044.

* cited by examiner

COOLING APPARATUS

TECHNICAL FIELD

The invention relates to a cooling apparatus in which an electronic component is mounted.

BACKGROUND ART

A method for cooling an electronic component by conducting heat, which is generated by driving the electronic component, to a heat sink is a conventionally used method. As a conventional structure of the heat sink, a technique for attaching a flat pipe (a cooling pipeline), through which a cooling medium flows, to a cooling plate has been disclosed. According to the technique, such a structure is adopted that the flat pipe is joined to the cooling plate via a long flat side portion of the flat pipe, and the heat that has transferred to the cooling plate is transferred to the flat pipe via a cross-sectional long side portion having a large heat transfer contact area (for example, see PTL 1).

CITATION LIST

Patent Literature

[PTL 1] JP-UM-A-2-28965

SUMMARY OF INVENTION

Technical Problem

The conventional cooling apparatus has such a structure that the cooling pipeline is arranged on a back surface side of the cooling plate in a flat plate shape, which constitutes the heat sink, when the electronic component is arranged on an upper surface side of the cooling plate. In the conventional cooling apparatus, the heat generated by the electronic component is conducted to the cooling pipeline via the cooling plate, and the electronic component can thereby be cooled. However, there has been a problem that the electronic component, the cooling plate, and the cooling pipeline are aligned at different heights in a thickness direction (a height direction with a flat surface of the cooling plate being amain surface) and thickness as the entire cooling apparatus is increased.

This invention has been made to solve the problem as described above and therefore has a purpose of providing a cooling apparatus that can achieve both of a low profile and securement of cooling performance.

Solution to Problem

A cooling apparatus according to this invention is characterized by including: an electronic component; a cooling plate for cooling the electronic component; an electronic component accommodating section that is attached to a periphery of an opening formed in the cooling plate and accommodates the electronic component therein; and a cooling pipeline that is disposed in a manner to surround an outer side surface section of the electronic component accommodating section and is joined to the cooling plate, in that the electronic component is arranged such that a side surface section thereof is in contact with an inner side of the electronic component accommodating section via a filler.

Advantageous Effects of Invention

According to the cooling apparatus of this invention, it is configured that the electronic component and the cooling pipeline are arranged on one side surface of the cooling plate and that the cooling pipeline is bent and disposed so as to surround an outer side surface of the electronic component accommodating section, which is provided in the cooling plate. Thus, a low profile as the entire cooling apparatus can be realized. Furthermore, the electronic component accommodating section is filled with the filler, and the electronic component is accommodated therein. Therefore, a cooling path from the side surface section of the electronic component via the electronic component accommodating section can be obtained, and cooling performance can thereby be improved.

Purposes, characteristics, perspectives, and effects other than the above of this invention will become further apparent from the following detailed description of this invention with reference to the drawings.

DESCRIPTION OF EMBODIMENTS

First Embodiment

Figure 1:
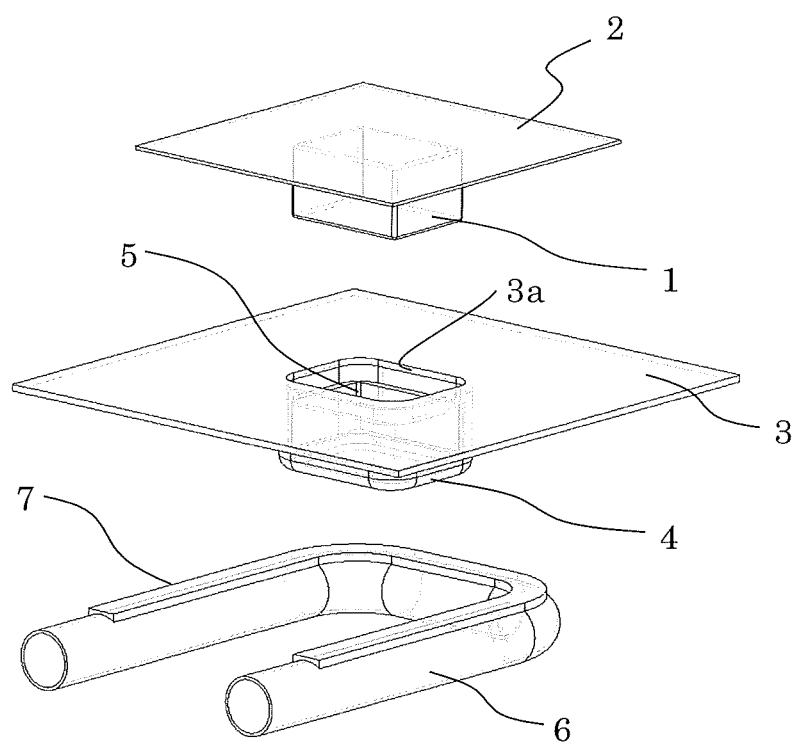
FIG. 1 is an exploded perspective view that depicts a cooling apparatus according to a first embodiment of this invention.
Figure 2:
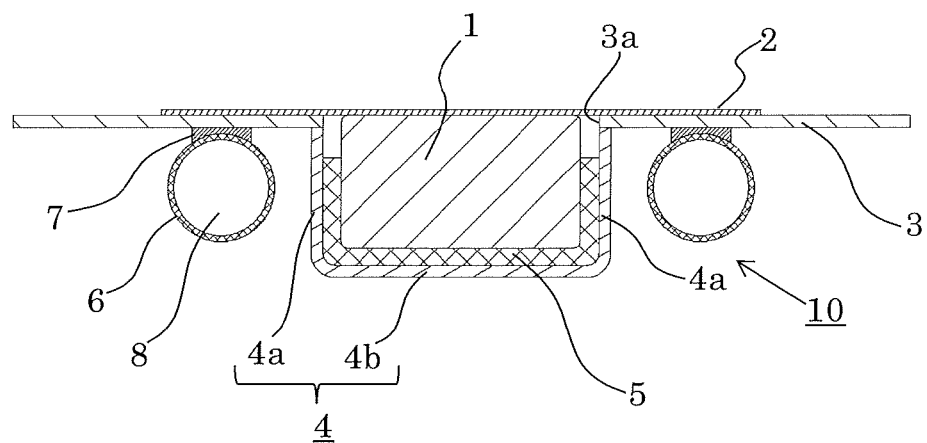
FIG. 2 is a cross-sectional view of the cooling apparatus according to the first embodiment of this invention.

A description will hereinafter be made on a cooling apparatus in a first embodiment of this invention with reference to FIG. 1 and FIG. 2. In each of the drawings, the same or corresponding members or portions are denoted by the same reference sign for the description. Of those, FIG. 1 is an exploded perspective view that depicts main sections of a cooling apparatus 10 according to the first embodiment of the invention. FIG. 2 is a cross-sectional view of the cooling apparatus 10 that is formed by assembling each component depicted in FIG. 1, and is a cross-sectional view along a thickness direction of a flat plate section of a cooling plate 3, which constitutes the cooling apparatus 10.

The cooling apparatus 10 has a cooling function for cooling an electronic component 1 as a heat generating component. As depicted in FIG. 1 and FIG. 2, the cooling plate 3 for cooling the electronic component 1 has a base section that has a flat plate shape and holds the electronic component 1, and a cooling pipeline 6, which will be described below, and the electronic component 1 are arranged on one flat surface side. An opening 3a in such a dimension to allow insertion of the electronic component 1 is formed in a flat surface section of the cooling plate 3. A recessed electronic component accommodating section 4, which has a bottomed cylindrical shape, is attached to a periphery of the opening 3a of this cooling plate 3 in a manner to be projected from an opening end thereof to the one flat surface side (a lower side of the sheet in FIG. 2). A potting material 5 as a filler is filled in the electronic component accommodating section 4, the electronic component 1 is arranged in a state of being embedded in the potting material 5, and the electronic component 1 is accommodated such that a side surface section and a bottom surface section of the electronic component 1 are in contact with the potting material 5. In addition, the cooling pipeline 6 is disposed in a manner to surround an outer side of a side surface section 4a of the electronic component accommodating section 4. The cooling pipeline 6 is joined to the one surface of the cooling plate 3, which is on the side where the electronic component accommodating section 4 is provided, via a joint material 7 as a heat conductive member.

Here, in this first embodiment, in which a flat surface shape of the electronic component 1 is a quadrilateral shape, the electronic component accommodating section 4 is formed to have a bottomed quadrilateral cylindrical shape that is formed of the side surface section 4a (four surface sections) and a bottom surface section 4b. It is configured that these side surface section 4a and bottom surface section 4b respectively surround the side surface section and the bottom surface section of the electronic component 1 and close the opening 3a of the cooling plate 3. That is, in the cooling apparatus 10, the opening 3a of the cooling plate 3, which has the flat plate shape, is formed with a recessed section by an inner side surface section of the electronic component accommodating section 4, and a through hole of the cooling plate 3 is in a closed state.

In addition, in an example of FIG. 1, the electronic component 1 is in a state of being mounted on a base plate 2, and the electronic component 1 is accommodated in the recessed section, which is formed of the inner side surface section of the electronic component accommodating section 4 of the cooling plate 3 and is filled with the potting material 5. When the electronic component 1 is accommodated therein, the electronic component 1 is inserted in and assembled to the recessed section, which is constructed of the inner side surface section of the electronic component accommodating section 4 of the cooling plate 3, such that the electronic component 1 faces downward in the sheet of FIG. 2, that is, the base plate 2 is located on an upper side and the electronic component 1 is located on the lower side. Then, the electronic component 1 is positioned in the recessed section of the electronic component accommodating section 4 by fixing a surface of the base plate 2, on which the electronic component 1 is placed, to an upper surface of the cooling plate 3.

Heat generated by the electronic component 1 can be conducted to the cooling plate 3 side via the potting material 5 and the electronic component accommodating section 4, and the base plate 2 is joined to the cooling plate 3. Thus, the heat can be conducted from an upper surface of the electronic component 1 to the cooling plate 3 side via the base plate 2.

Furthermore, as described above, the cooling pipeline 6, which surrounds the electronic component 1 of the cooling apparatus 10 and a periphery of the side surface section thereof, is arranged on a back surface side of the flat surface section of the cooling plate 3, and the heat generated by the electronic component 1 is conducted from the flat surface section of the cooling plate 3 to the cooling pipeline 6 via a heat conductive member that constitutes the electronic component accommodating section 4 of the cooling plate 3. Accordingly, when seen in the thickness direction of the cooling plate 3, the electronic component 1 and the cooling pipeline 6 are arranged in a manner to overlap each other in terms of height. Thus, the cooling apparatus 10 of the invention has a lower profile than the conventional cooling apparatus, in which these components are arranged at different heights.

Moreover, the electronic component 1 is accommodated in the electronic component accommodating section 4 having a recessed structure, which is projected from the flat surface section to the back surface side of the cooling plate 3, via the potting material 5, and the side surface section and the bottom surface section of the electronic component 1 are in contact with an electrical conductive member, which constitutes the electronic component accommodating section 4, via the potting material 5. In the related art, the electronic component 1 has been cooled only through a mounted surface thereof. However, according to the first embodiment of the invention, the electronic component 1 can be cooled by conducting the heat not only from the bottom surface section of the electronic component 1 but also from the side surface section thereof. Thus, compared to the related art, a joined area between the electronic component 1 and the cooling plate 3 is increased, and a cooling property can thereby be improved.

A detailed description will hereinafter be made on the cooling apparatus 10 of the first embodiment.

In the cooling apparatus 10 of the first embodiment of the invention, which is depicted in FIG. 1 and FIG. 2, the electronic component 1, such as a semiconductor or a transistor, is mounted on the base plate 2 in advance. When the electronic component 1 is assembled to the cooling plate 3, this base plate 2 is fixed to the cooling plate 3 such that a mounting surface thereof faces downward. Accordingly, an external connection terminal is formed on an upper surface (a back surface of the mounting surface) side of the base plate 2.

The cooling plate 3 is formed with the opening 3a, in which the electronic component 1 whose flat surface shape is the quadrilateral shape can be inserted and whose dimension is one size larger than that of the electronic component 1. The electronic component accommodating section 4 for accommodating the electronic component 1 is attached thereto in advance, so as to be projected from the periphery of the opening 3a to the back surface side. For example, this electronic component accommodating section 4 has the bottomed quadrilateral cylindrical shape that is formed by combining plate members having heat conductive properties. The electronic component accommodating section 4 is in such a state that an upper end thereof is joined to the periphery of the opening 3a on the back surface of the cooling plate 3, that the electronic component accommodating section 4 is integrated with the cooling plate 3, and that the electronic component accommodating section 4, which is formed of the recessed heat conductive members, closes the opening 3a as the through hole of the cooling plate 3. Grease for reducing contact thermal resistance is applied between the cooling plate 3 and the electronic component accommodating section 4, and the cooling plate 3 and the electronic component accommodating section 4 are fixed by screwing or brazing; however, these are not depicted.

The cooling pipeline 6, through which a coolant 8 as a cooling medium or the like flow, is arranged on the back surface side of the cooling plate 3 in a manner to meander around an outer side surface section of the electronic component accommodating section 4, and is joined to the back surface of the flat surface section of the cooling plate 3 by the joint material 7 as the heat conductive member. The cooling pipeline 6, which surrounds the electronic component accommodating section 4, is shaped to be bent in a U shape as exemplified in FIG. 1. In the case where the side surface section of the electronic component 1 has four surfaces, the cooling pipeline 6 is in a state of surrounding peripheries of the three side surface sections, that is, in a state of arranging the electronic component 1 on an inner side of bending of a U-shaped pipeline. It is configured that the heat of the electronic component 1 transferred to the cooling pipeline 6 is carried away by the coolant 8, which flows through the cooling pipeline 6, and the electronic component 1 is thereby cooled.

Before the electronic component 1, which is mounted on the base plate 2, is assembled to the cooling plate 3, to which the electronic component accommodating section 4 and the cooling pipeline 6 are joined, the potting material 5 as the filler is poured into the recessed section in the electronic component accommodating section 4. Thereafter, the electronic component 1 is inserted and accommodated in the recessed section of the electronic component accommodating section 4 of the cooling plate 3 such that the mounting surface of the base plate 2, on which the electronic component 1 is mounted, faces downward. At this time, the side surfaces and the bottom surface of the electronic component 1 are in a state of being immersed in the potting material 5 as the filler. This potting material 5 is a liquid at an initial pouring stage, and has a property of being solidified by natural drying. Accordingly, after the potting material 5 is poured, the electronic component 1 is immersed in the potting material 5 in a liquid state. In this way, the potting material 5 can permeate the surfaces of the electronic component 1 thoroughly. Thereafter, the potting material 5 is solidified with a lapse of time, and the electronic component 1 and the electronic component accommodating section 4 can be brought into close contact with each other via this potting material 5.

Noted that, in regard to a joined state between the base plate 2 and the cooling plate 3, the grease is applied to reduce the contact thermal resistance between the base plate 2 and the cooling plate 3, and the base plate 2 and the cooling plate 3 are fixed by screwing; however, these are not depicted.

Here, the cooling plate 3, the electronic component accommodating section 4, and the cooling pipeline 6 are each constructed of a material having a superior heat conductive property, such as aluminum, in order to reduce thermal resistance. In addition, the potting material 5 is constructed of silicone or the like in order to reduce the thermal resistance. The joint material 7 is typically constructed of a material having a superior heat conductive property, such as an aluminum-brazed material, but is not limited thereto. In addition, the coolant 8 described herein is not limited to water but may be a cooling medium of a fluid with a cooling effect.

According to the configuration of this first embodiment, the heat of the electronic component 1 is radiated to the coolant 8 largely through two paths. One of the paths is a path in which the heat of the electronic component 1 is transferred to the cooling plate 3 via the base plate 2, is transferred from the cooling plate 3 to the cooling pipeline 6 via the joint material 7, is transferred to the coolant 8, which flows through the cooling pipeline 6, and is radiated. The other path is a path in which the heat of the electronic component 1 is transferred from the bottom surface and the side surface section of the electronic component 1 to the recessed electronic component accommodating section 4 via the potting material 5, is further transferred from the cooling plate 3 to the cooling pipeline 6 via the joint material 7, is transferred to the coolant 8, which flows through the cooling pipeline 6, and is radiated. As described above, the heat of the electronic component 1 is radiated from the upper surface of the electronic component 1, which is in contact with the base plate 2, as well as from all of the side surface sections and the bottom surface, which are in contact with the potting material 5. Therefore, the cooling property as the cooling apparatus 10 can be secured.

In addition, it is configured that both of the electronic component 1 and the cooling pipeline 6 are arranged at the same height on the back surface side of the cooling plate 3. Therefore, compared to a case where the electronic component 1 and the cooling pipeline 6 are arranged on different surfaces, the low profile can be realized.

As depicted in FIG. 1 and FIG. 2, because the electronic component 1, such as the semiconductor, is typically mounted on the base plate 2 or the like, the heat of the electronic component 1 is radiated to the coolant 8 largely through the two paths. However, in the case where the electronic component 1 is a large component having a different shape, such as the transistor, the electronic component 1 may not be mounted on the base plate 2. In such a case, because the base plate 2 itself does not exist in the structure, the heat radiation path via the base plate 2 no longer exists, and the heat is radiated only via the potting material 5. In this example, the case where the base plate 2 is provided has been described; however, the invention does not limit presence or absence of the base plate 2. In a configuration that is not provided with the base plate 2, the electronic component 1 can be fixed to the cooling plate 3 by a method for holding the electronic component 1 by using a sheet metal component or the like and fixing the sheet metal component to the cooling plate 3 by a screw, or the like.

In FIG. 1 and FIG. 2, the case where one unit of the electronic component 1 is arranged on the cooling plate 3 is exemplified; however, a large number of the electronic components 1 can also be arranged on one unit of the cooling plate 3, which serves as a heat sink. In such a case, unlike the above example in which one unit of the electronic component 1 is accommodated in one unit of the electronic component accommodating section 4, it is configured to accommodate the plural electronic components 1 in one unit of the electronic component accommodating section 4. However, a region where outer peripheries of the electronic components 1 are in the vicinity of the cooling pipeline 6 is limited, and a rate of surrounding outer peripheries of heat generating bodies by the cooling pipeline 6 is lowered. Thus, this configuration is suited for a case of accommodating the electronic components 1 with margins in terms of the heat.

In addition, in the case where the plural electronic components 1 are separately arranged on both of the surfaces of the cooling plate 3, the low profile of the cooling apparatus 10 cannot be realized. However, a mounting area for the electronic components 1 can be obtained. Here, in the case where the electronic component 1 is arranged on the upper surface side of the cooling plate 3, to which the cooling pipeline 6 is not joined, in a region where the electronic component 1 is considered to interfere with other sections, as described in the first embodiment of the invention, a mode for accommodating the electronic component 1 on the back surface side of the cooling plate 3, to which the cooling pipeline 6 is joined, can be adopted. In this way, a mounting mode can selectively be used in a manner to correspond to a layout, and thus a layout property of the cooling apparatus 10 can be improved.

Noted that, in general, the cooling apparatus 10 of the invention is used by being accommodated in a product that includes an outer casing.

Second Embodiment

In the above-mentioned embodiment 1, it has been configured that the cooling pipeline 6 is joined to the back surface of the cooling plate 3. Meanwhile, the cooling apparatus 10 of a second embodiment is characterized in that the cooling pipeline 6 is joined not only to the back surface of the cooling plate 3 but also to the outer side surface section of the electronic component accommodating section 4 via the joint material 7.

Figure 3:
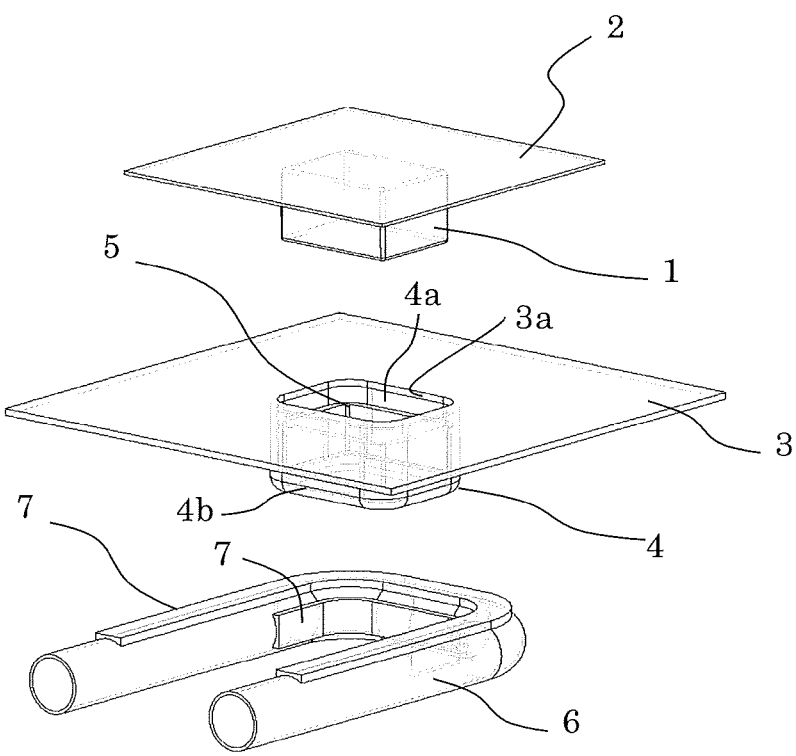
FIG. 3 is an exploded perspective view that depicts a cooling apparatus according to a second embodiment of this invention.
Figure 4:
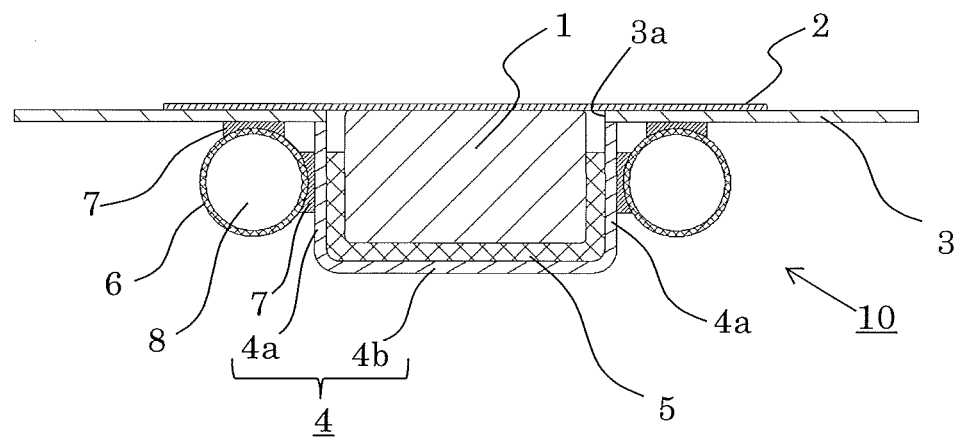
FIG. 4 is a cross-sectional view of the cooling apparatus according to the second embodiment of this invention.

FIG. 3 is an exploded perspective view of the cooling apparatus 10 according to the second embodiment of the invention, and FIG. 4 is a cross-sectional view of the cooling apparatus 10 according to the second embodiment. The cooling apparatus 10 according to the second embodiment of the invention, which is depicted in FIG. 3 and FIG. 4, is configured that the cooling pipeline 6 is arranged in the vicinity of the side surface section 4a of the electronic component accommodating section 4 and that outer side surfaces of the side surface section 4a of the electronic component accommodating section 4 and a surface of the cooling pipeline 6 are joined by the joint material 7.

According to the configuration of the cooling apparatus 10 of this second embodiment, the side surface section 4a of the electronic component accommodating section 4 and the cooling pipeline 6 are joined via the joint material 7. Accordingly, a heat radiation path between the electronic component 1 and the coolant 8 can be shortened. In addition, because the heat radiation path is extended to be longer than that of the first embodiment, the thermal resistance between the electronic component 1 and the coolant 8 can be reduced. Furthermore, the increased heat radiation path is not affected by the contact thermal resistance between the electronic component accommodating section 4 and the cooling plate 3.

According to the configuration of the cooling apparatus 10 of this second embodiment, the thermal resistance between the electronic component 1 and the coolant 8 is reduced, and cooling performance can be secured for the electronic component 1 whose heat generation amount is large.

Third Embodiment

Figure 5:
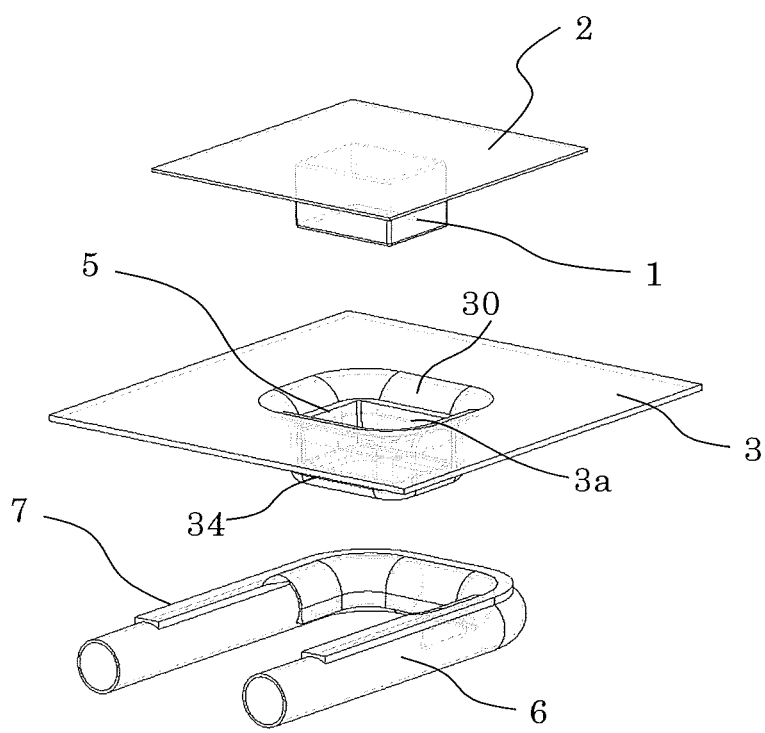
FIG. 5 is an exploded perspective view that depicts a cooling apparatus according to a third embodiment of this invention.
Figure 6:
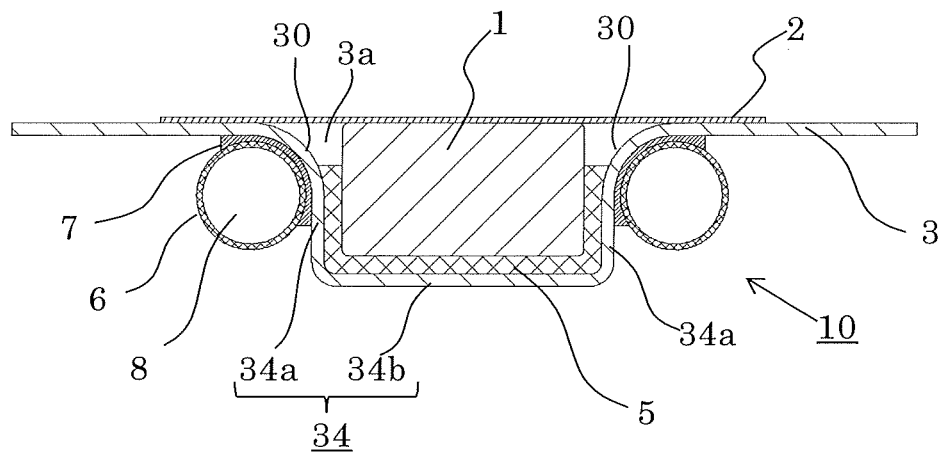
FIG. 6 is a cross-sectional view of the cooling apparatus according to the third embodiment of this invention.

In the above-described first embodiment and second embodiment, it has been described that the cooling plate 3 and the electronic component accommodating section 4 have separate structures and are joined to have the integrated structure. Meanwhile, as depicted in FIG. 5 and FIG. 6, the cooling apparatus 10 of this third embodiment is characterized in that a recessed section that is formed by drawing a portion of the cooling plate 3 serves as an electronic component accommodating section 34 and that the flat surface section of the cooling plate 3 and the electronic component accommodating section 34 have an integrated structure. Noted that the opening 3a is not the through hole as described above but an upper end opening of a recessed hole of the electronic component accommodating section 34.

FIG. 5 is an exploded perspective view of the cooling apparatus 10 according to the third embodiment of the invention, and FIG. 6 is a cross-sectional view of the cooling apparatus 10 according to the third embodiment. As depicted in FIG. 5 and FIG. 6, in the cooling apparatus 10 of the third embodiment of the invention, the recessed electronic component accommodating section 34 is integrally formed by drawing the cooling plate 3. The structure of the recessed electronic component accommodating section 4, which is a separate component from the cooling plate 3 in the first and second embodiments, is eliminated in this third embodiment. Noted that the electronic component accommodating section 34, which is formed by drawing, is formed to have a bottomed quadrilateral cylindrical shape, for example, a surface section thereof that is in the vicinity of the side surface section of the electronic component 1 is a side surface section 34a, and a surface section thereof that is in the vicinity of the bottom surface section of the electronic component 1 is a bottom surface section 34b.

In addition, as depicted in FIG. 6, a drawn section of the cooling plate 3 is a joined section 30 on an upper end side of the side surface section 34a of the electronic component accommodating section 34. This joined section 30 is formed in a rounded shape that is along the outer side surface section of the cooling pipeline 6, and the joined section 30 in the rounded shape is made close and joined to an outer shape of the cooling pipeline 6 by the joint material 7. In this way, a heat radiation surface from the cooling plate 3 can be expanded to be larger than that in the first and second embodiments.

According to the cooling apparatus 10 of this third embodiment, the cooling plate 3 and the cooling pipeline 6 are joined via the joint material 7 while including the joined section 30 in the rounded shape. Thus, the flat surface section of the cooling plate 3 and the joined section 30 of the electronic component accommodating section 34 can be cooled via the joint material 7. In addition, along with an increase in the area that constitutes the heat radiation path, a heat path between the electronic component 1 and the coolant 8 in the entire cooling apparatus 10 can be shortened. Furthermore, it is needless to say that the cooling apparatus 10 is not affected by the contact thermal resistance that exists between the electronic component accommodating section 4 and the cooling plate 3 in the configurations of the above-described first and second embodiments.

According to the configuration of the cooling apparatus 10 of this third embodiment, the thermal resistance between the electronic component 1 and the coolant 8 can be reduced, and the cooling performance can be secured for the electronic component 1 whose heat generation amount is large.

Fourth Embodiment

In the above-described first to third embodiments, the cooling pipeline 6 having a circular cross-sectional shape has been described. Meanwhile, the cooling apparatus 10 of this fourth embodiment is characterized in that a cooling pipeline 6a is constructed of a flat pipe having an oval cross-sectional shape.

Figure 7:
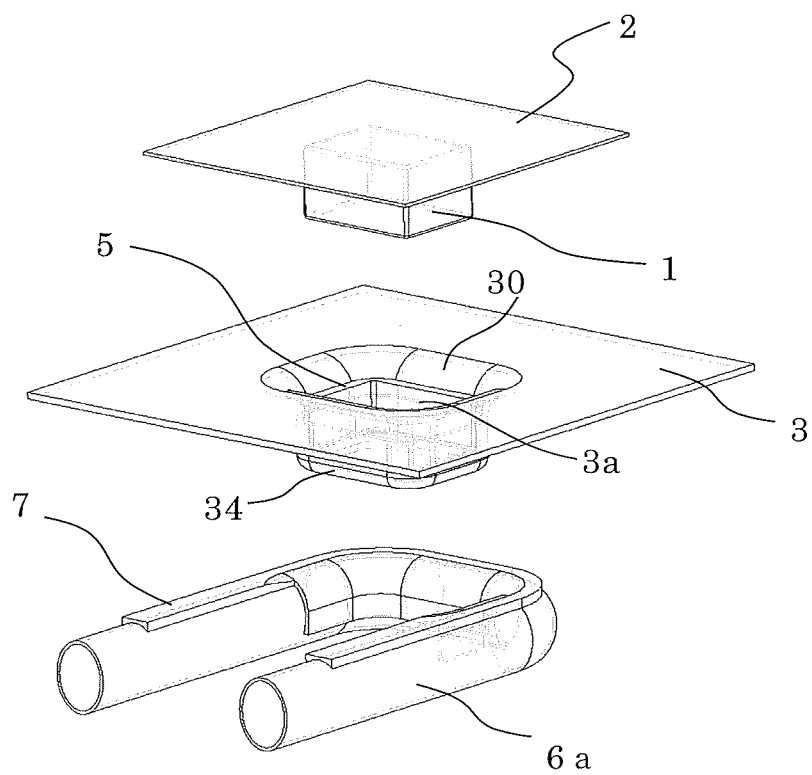
FIG. 7 is an exploded perspective view that depicts a cooling apparatus according to a fourth embodiment of this invention.
Figure 8:
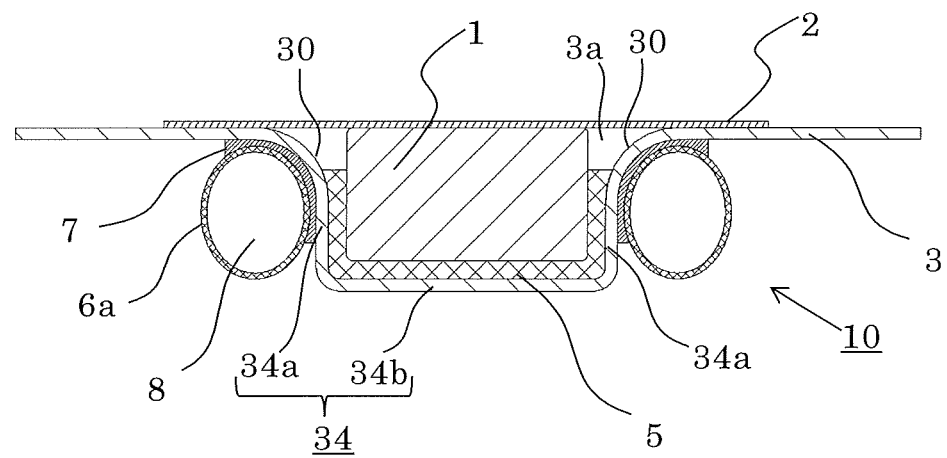
FIG. 8 is a cross-sectional view of the cooling apparatus according to the fourth embodiment of this invention.

FIG. 7 is an exploded perspective view of the cooling apparatus 10 according to the fourth embodiment of the invention, and FIG. 8 is a cross-sectional view of the cooling apparatus 10 according to the fourth embodiment. According to the cooling apparatus 10 of the fourth embodiment, which is depicted in FIG. 7 and FIG. 8, it is configured that the cooling pipeline 6 is formed of the flat pipe. In this way, as depicted in FIG. 8, the side surface section 34a of the electronic component accommodating section 34 and the cooling pipeline 6a are arranged at the same height in a thickness direction of the cooling apparatus 10. The cooling pipeline 6a is adjusted such that height thereof is increased within a range where the thickness of the entire cooling apparatus 10 is not increased. In this way, it can be configured that a joined area between the side surface section 34a and the cooling pipeline 6a can be increased.

According to the configuration of the cooling apparatus 10 of this fourth embodiment, the cooling pipeline 6a is formed of the flat pipe, and the heat of the electronic component 1 can be conducted to the flat pipe via a cross-sectional long side section with a large heat transfer contact area. Accordingly, compared to a case where the pipeline having the circular cross section is used, a joined area between the cooling plate 3 and the cooling pipeline 6a is expanded, and the thermal resistance between the electronic component 1 and the coolant 8 is reduced. In addition, because the cooling pipeline 6a is formed of the flat pipe, a distance from an inner wall of the cooling pipeline 6a to the center of the coolant 8 is shortened, and the thermal resistance between the cooling pipeline 6a and the coolant 8 is reduced.

According to the configuration of the cooling apparatus 10 of this fourth embodiment, the heat that has been conducted to the cooling pipeline 6a is conducted to the coolant 8, which flows through the pipeline, via an inner surface of a flat serpentine pipe having long wet edge (cross-sectional peripheral length) length, and is thereby collected. Thus, heat transfer efficiency from the cooling plate 3 to the coolant 8, that is, heat collection efficiency of the heat sink can be improved. Therefore, the thermal resistance between the electronic component 1 and the coolant 8 is reduced, and the cooling performance can be secured for the electronic component 1 whose heat generation amount is large.

Fifth Embodiment

In the above-described first to fourth embodiments, it has been described that the electronic component accommodating section 4 or 34 forms the recessed shape by the bottomed cylindrical shape. Meanwhile, the cooling apparatus 10 of this fifth embodiment 5 is characterized in that an electronic component accommodating section 35 is constructed of a cylindrical member (a side surface section) for surrounding the side surface section of the electronic component 1 and has a structure of not including a bottom surface section.

Figure 9:
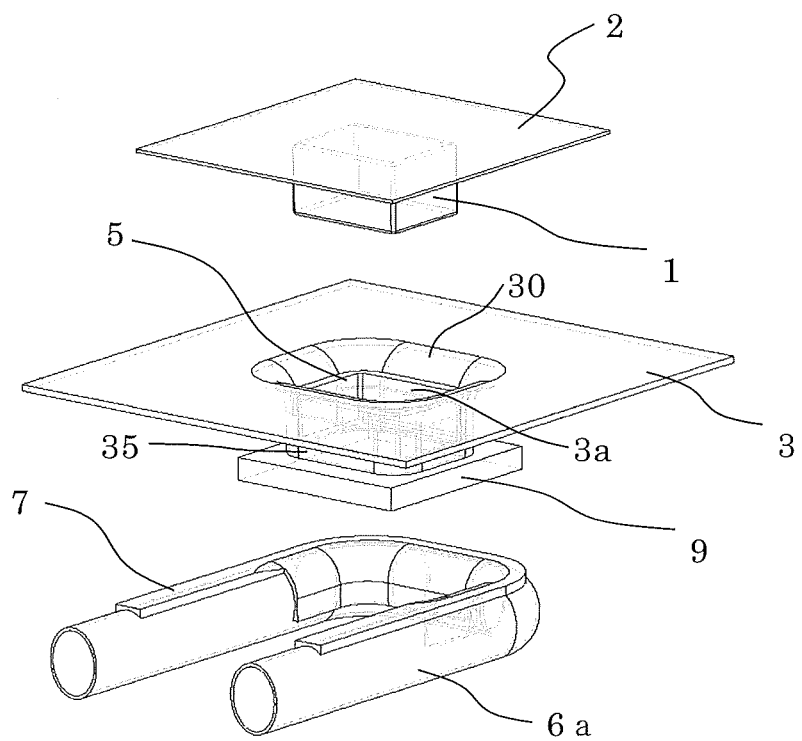
FIG. 9 is an exploded perspective view that depicts a cooling apparatus according to a fifth embodiment of this invention.
Figure 10:
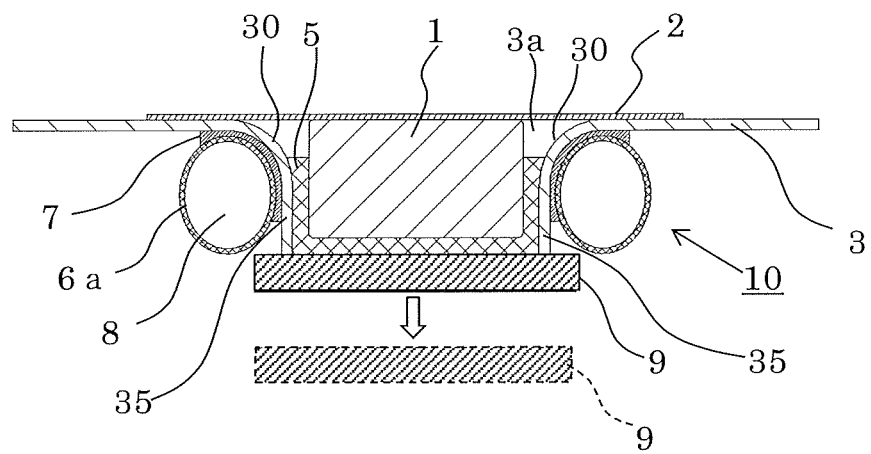
FIG. 10 is a cross-sectional view of the cooling apparatus according to the fifth embodiment of this invention.

FIG. 9 is an exploded perspective view of the cooling apparatus 10 according to the fifth embodiment of the invention, and FIG. 10 is a cross-sectional view of the cooling apparatus 10 according to the fifth embodiment. As depicted in FIG. 9 and FIG. 10, according to the cooling apparatus 10 of the fifth embodiment of the invention, the electronic component accommodating section 35 for accommodating the electronic component 1 is configured to have a cylindrical shape in which a hole is formed on a bottom surface.

According to the configuration of the cooling apparatus of this fifth embodiment, the electronic component accommodating section 35 has such a shape that the recessed bottom surface has the hole. As depicted in FIG. 10, the cooling apparatus 10 is formed by a method for: pouring the potting material 5 into a recessed section in a state where the hole on the bottom surface of the cylindrical electronic component accommodating section 35 is closed by a jig 9 so that the potting material 5 is prevented from flowing out to the periphery from the opened bottom surface section during filling of the potting material 5; and detaching the jig 9 after the potting material 5 is solidified. In this way, because elements that constitute the thickness of the entire cooling apparatus 10 become the electronic component 1 (including the base plate 2) and the potting material 5 only, the low profile can be realized.

In addition, at a stage of causing inflow and solidification of the potting material 5, the bottom surface of the electronic component 1 is brought into a state of contacting the jig 9. In this way, it can be configured that the potting material 5 does not flow between the electronic component 1 and the jig 9. It can also be configured that the potting material 5 is not arranged in the bottom surface section of the electronic component 1 and that the surface of the electronic component 1 is exposed by detaching the jig 9 after the potting material 5 is solidified. The potting material 5 is not included as the element that constitutes the thickness of the cooling apparatus 10, and the electronic component 1 can thereby be the only element that constitutes the thickness thereof. With this configuration, the further low profile can be realized.

According to the configuration of this fifth embodiment, the further low profile can be realized while the cooling performance of the cooling apparatus 10 is secured.

Sixth Embodiment

In the above-described first to third embodiments, it has been described that the cooling pipeline 6 has the circular cross-sectional shape. However, the pipeline that is used for a cooling purpose can have a cross-sectional shape other than a circle. In this sixth embodiment, a description will be made on a case where a cooling pipeline 6b of the cooling apparatus 10 is constructed of a rectangular pipe having a rectangular cross-sectional shape.

Figure 11:
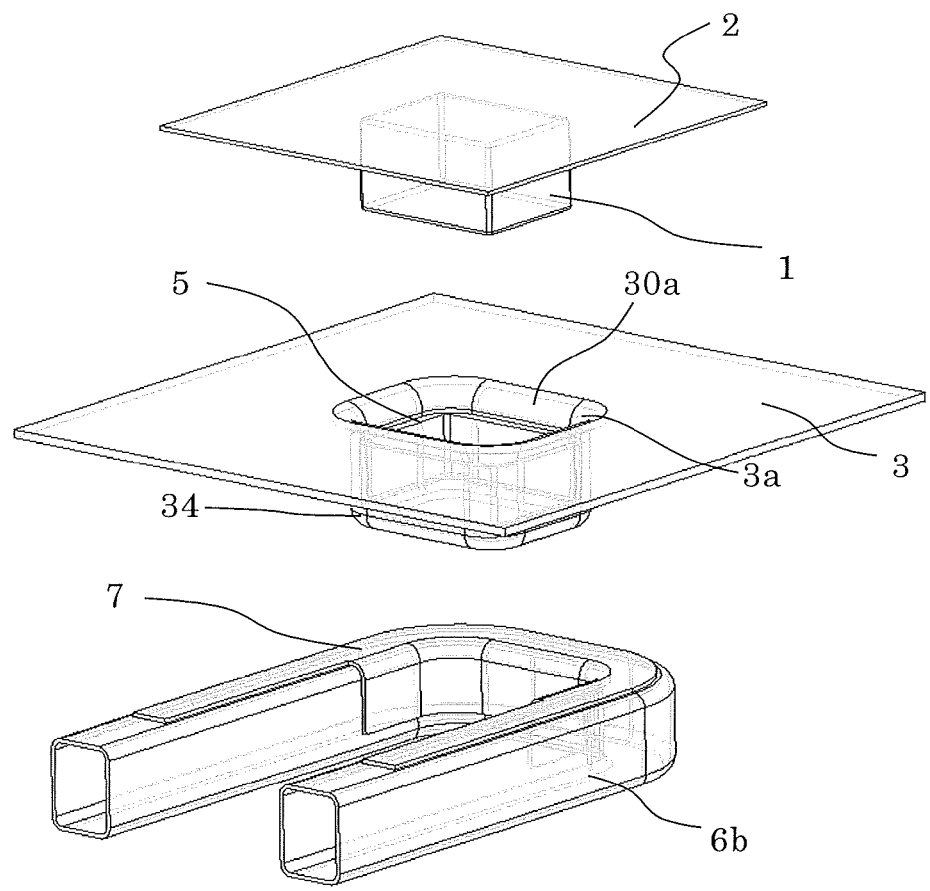
FIG. 11 is an exploded perspective view that depicts a cooling apparatus according to a sixth embodiment of this invention.
Figure 12:
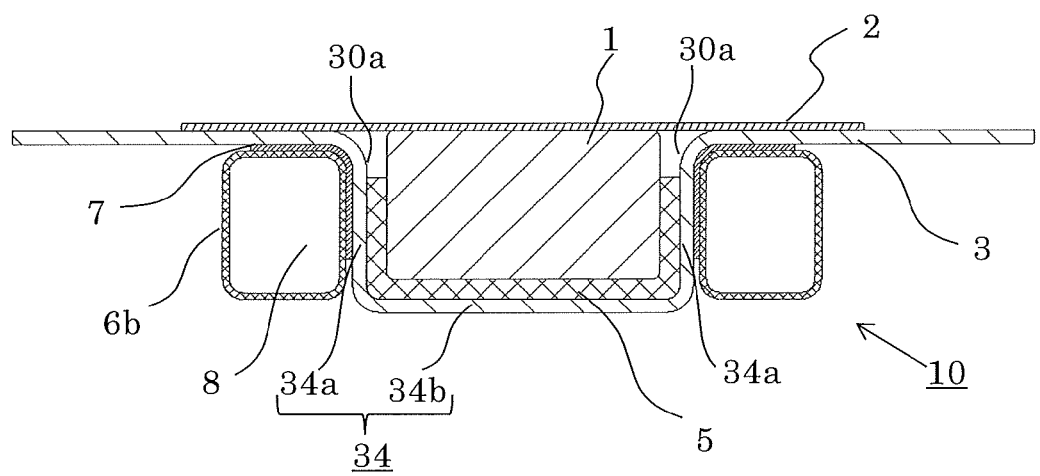
FIG. 12 is a cross-sectional view of the cooling apparatus according to the sixth embodiment of this invention.

FIG. 11 is an exploded perspective view that depicts the cooling apparatus 10 according to the sixth embodiment of the invention, and FIG. 12 is a cross-sectional view of the cooling apparatus 10 according to the sixth embodiment. As depicted in FIG. 11 and FIG. 12, the cooling pipeline 6b is constructed of the rectangular pipe in the cooling apparatus 10 of the sixth embodiment. Accordingly, for example, as depicted in FIG. 12, the side surface section 34a of the electronic component accommodating section 34 and the cooling pipeline 6b are arranged at the same height in the thickness direction of the cooling apparatus 10. The cooling pipeline 6b is adjusted such that height thereof is increased within a range where the thickness of the entire cooling apparatus 10 is not increased. In this way, a joined area between the side surface section 34a and the cooling pipeline 6b can be increased.

In addition, in FIG. 12, the cooling pipeline 6b as the rectangular pipe exemplifies a rectangular pipe that is surrounded by four surface sections. An outer peripheral shape of this cooling pipeline 6b at least has: a surface section that is along the side surface section 34a of the electronic component accommodating section 34; a corner section that is along the joined section 30a of the cooling plate 3; and a surface section that is along the back surface of the cooling plate 3. These surface sections and the like are in contact with the cooling plate 3 via the joint material 7.

Here, as depicted in FIG. 12, the cooling pipeline 6b as the rectangular pipe exemplifies a rectangular pipe having an oblong cross-sectional shape. Across-sectional long side section of this rectangular pipe is joined to the side surface section 34a of the electronic component accommodating section 34 via the joint material 7. Thus, the heat generated by the electronic component 1 is conducted to the cooling pipeline 6b, which is the rectangular pipe, via the cross-sectional long side section whose heat transfer contact area is larger than a cross-sectional short side section of the rectangular pipe.

Noted that the cross-sectional short side section of the cooling pipeline 6b, which is the rectangular pipe, is configured that a heat conductive distance to the heat generating body is longer than that of the cross-sectional long side section. However, it is needless to say that the heat of the electronic component 1 is transmitted to this cross-sectional short side section via the cooling plate 3 and thus the cross-sectional short side section also contributes to heat radiation.

According to this sixth embodiment, the cooling pipeline 6b having the rectangular cross-sectional shape is adopted. Thus, compared to the case where the pipeline having the circular cross section is adopted, a joined area between the cooling plate 3 and the cooling pipeline 6b is expanded, the thermal resistance between the electronic component 1 and the coolant 8 can be reduced. In addition, the cooling pipeline 6b has the oblong cross-sectional shape. Thus, a distance from an inner wall of the cooling pipeline 6b to the center of the coolant 8 is shortened, and the thermal resistance between the cooling pipeline 6b and the coolant 8 can also be reduced.

As described above, according to the configuration of the cooling apparatus 10 of this sixth embodiment, the heat that has been conducted to the cooling pipeline 6b is conducted to the coolant 8, which flows through the pipeline, via an inner surface of the rectangular pipe having long wet edge (cross-sectional peripheral length) length, and is thereby collected. Thus, the heat transfer efficiency from the cooling plate 3 to the coolant 8, that is, the heat collection efficiency of the heat sink can be improved. Therefore, the thermal resistance between the electronic component 1 and the coolant 8 is reduced, and the cooling performance can be secured for the electronic component 1 whose heat generation amount is large.

Seventh Embodiment

In the above-described first to sixth embodiments, it has been described that the cooling pipelines 6, 6a, 6b are pipe members respectively having the circular, oval, and rectangular cross sections.

Figure 13:
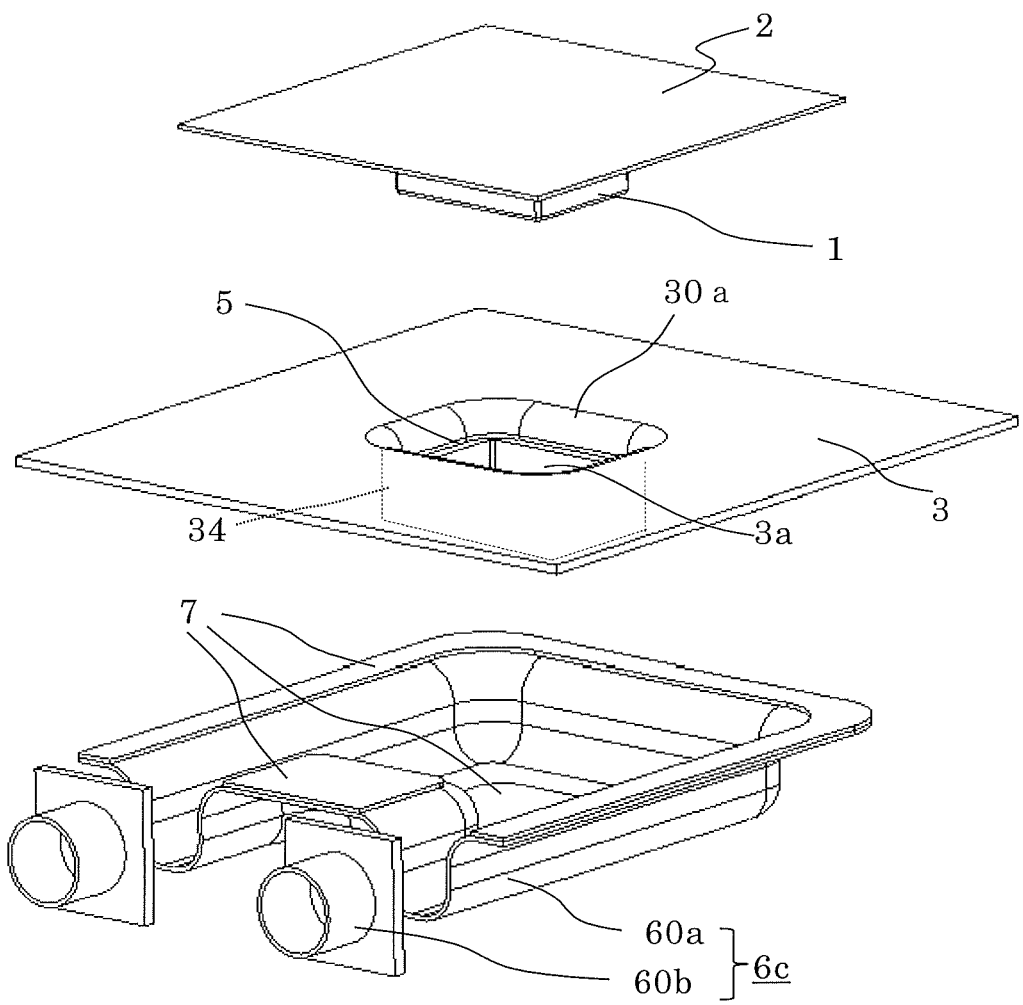
FIG. 13 is an exploded perspective view that depicts a cooling apparatus according to a seventh embodiment of this invention.
Figure 14:
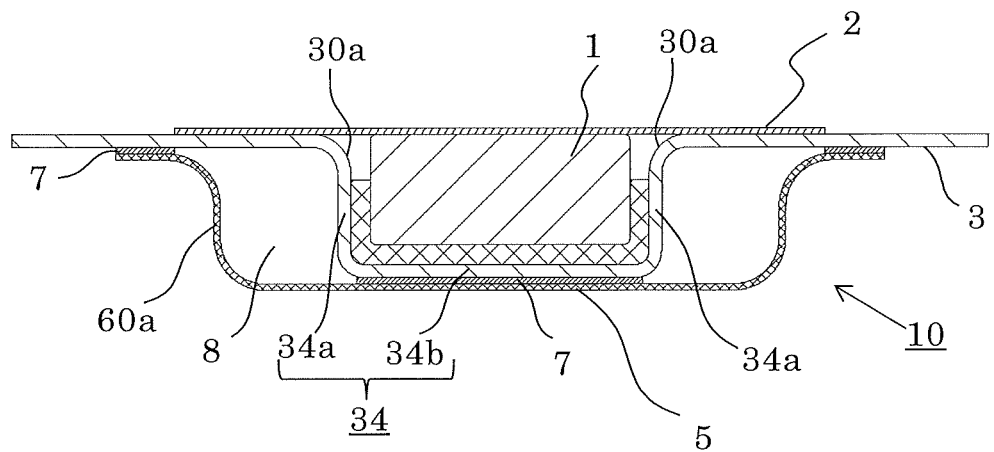
FIG. 14 is a cross-sectional view of the cooling apparatus according to the seventh embodiment of this invention.

In this seventh embodiment, a description will be made on the cooling apparatus 10 that includes a cooling pipeline 6c whose shape is other than that of any of the pipe members. FIG. 13 is an exploded perspective view of the cooling apparatus 10 according to the seventh embodiment of the invention, and FIG. 14 is a cross-sectional view of the cooling apparatus 10 according to the seventh embodiment.

As depicted in FIG. 13, the cooling pipeline 6c is configured by combining a metal plate 60a and couplers 60b. As depicted in FIG. 14, it is configured that a space is formed around the electronic component accommodating section 34 at a time when the metal plate 60a having a recessed section is adhered to the back surface of the cooling plate 3 and that the space is used as a flow path through which the coolant 8 flows.

As depicted in FIG. 13, the metal plate 60a is formed with a recessed section that is used to accommodate the electronic component 1 therein and to secure the space for a flow of the cooling medium around the electronic component 1. In addition, as depicted in FIG. 14, an edge section of the metal plate 60a is joined to the back surface side of the cooling plate 3 via the joint materials 7, and a bottom surface section of the recessed section is joined to the bottom surface section 34b of the electronic component accommodating section 34 via the joint material 7. Furthermore, between the cooling plate 3 and the metal plate 60a, the space, which serves as the flow path for the flow of the coolant 8, is secured in a manner to surround an outer periphery of the side surface section 34a of the electronic component accommodating section 34.

Moreover, it is configured that the couplers 60b, which respectively serve as an inlet hole and a discharge port of the coolant 8, are connected to ends of the flow path of the metal plate 60a.

According to the configuration of this seventh embodiment, the cooling pipeline 6c is formed by using the metal plate 60a and the couplers 60b, and a portion of the cooling plate 3 fulfills a role of the pipeline, through which the cooling medium flows. Thus, it is structured that the cooling plate 3 directly contacts the coolant 8, and the thermal resistance between the electronic component 1 and the coolant 8 is reduced.

As described above, according to the configuration of this seventh embodiment, the thermal resistance between the electronic component 1 and the coolant 8 is reduced, and the cooling performance can be secured for the electronic component 1 whose heat generation is significant.

Eighth Embodiment

As the electronic component accommodating section 35 for accommodating the electronic component 1, the above-described fifth embodiment has exemplified the cylindrical electronic component accommodating section 35 whose bottom surface is perforated. In addition, in the above-described seventh embodiment, the example of forming the cooling pipeline 6 by combining the metal plate 60a and the couplers 60b has been described. In this eighth embodiment, a description will be made on the cooling apparatus 10 that can be obtained by combining the electronic component accommodating section 35 of the fifth embodiment and the cooling pipeline 6c of the seventh embodiment.

Figure 15:
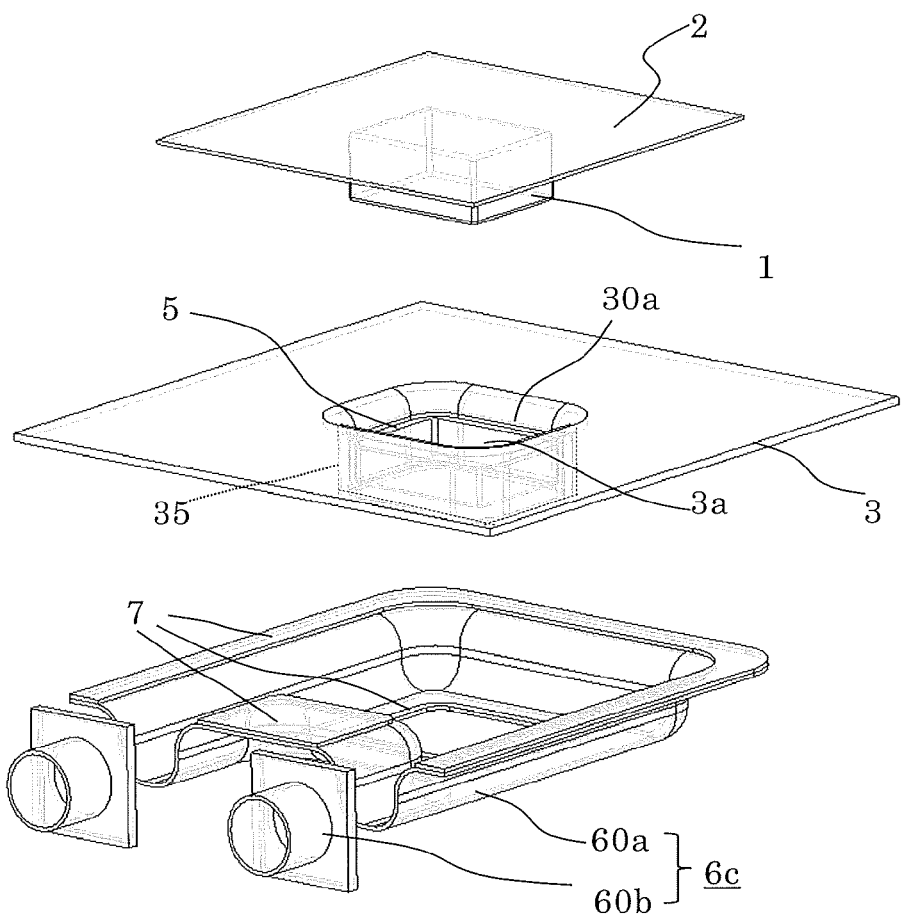
FIG. 15 is an exploded perspective view that depicts a cooling apparatus according to an eighth embodiment of this invention.
Figure 16:
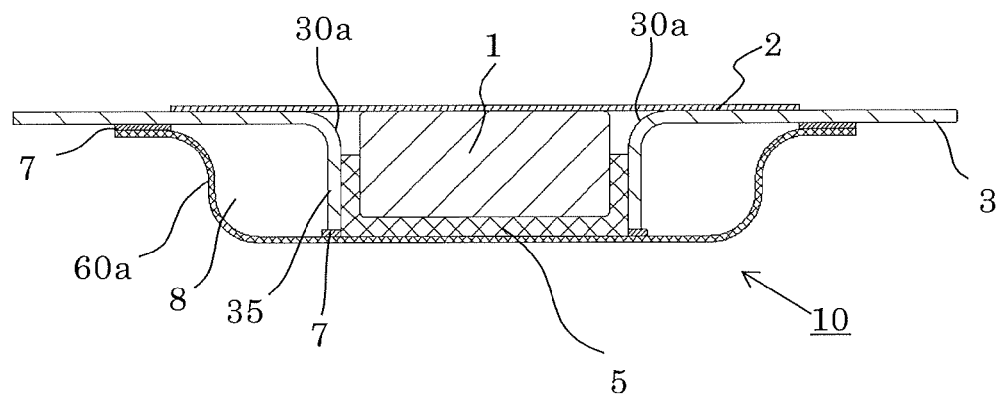
FIG. 16 is a cross-sectional view of the cooling apparatus according to the eighth embodiment of this invention.

FIG. 15 is an exploded perspective view that depicts the cooling apparatus 10 according to the eighth embodiment of the invention, and FIG. 16 is a cross-sectional view of the cooling apparatus 10 according to the eighth embodiment. In the above-described seventh embodiment, the electronic component accommodating section 34 is structured to have the side surface section 34a and the bottom surface section 34b. Meanwhile, as depicted in FIG. 15 and FIG. 16, as the electronic component accommodating section 35 of the eighth embodiment of the invention, a cylindrical electronic component accommodating section, which does not have the bottom surface section and is only constructed of the side surface section, is used.

According to the configuration of this eighth embodiment, it is assembled such that the cylindrical electronic component accommodating section 35, which does not have the bottom surface section, is provided in an integrated manner with the cooling plate 3, that the hole on the bottom surface of the cylindrical electronic component accommodating section 35 is closed by the metal plate 60a of the cooling pipeline 6c so that the potting material 5 does not flow out to the periphery of the recessed section from the hole, and that the potting material 5 is poured into the electronic component accommodating section 35.

The elements for constituting the thickness of the thus-obtained cooling apparatus 10 are the base plate 2, the electronic component 1, the potting material 5, and the metal plate 60a of the cooling pipeline 6c only. Therefore, a lower profile than that in the seventh embodiment by the thickness of the bottom surface section 34b can be realized.

According to the configuration of this eighth embodiment, the further lower profile of the cooling apparatus 10 can be realized while the cooling performance of the cooling apparatus 10 is secured.

Noted that, for the invention, the embodiments can freely be combined and each of the embodiments can appropriately be modified or removed within the scope of the invention.

The invention claimed is:

1. A cooling apparatus, comprising:
   an electronic component;
   a cooling plate for cooling the electronic component;
   an electronic component accommodating section that is attached to a periphery of an opening formed in the cooling plate and accommodates the electronic component therein; and
   a cooling pipeline that is disposed at a same level as the electronic component in a manner to surround at least three sides of an outer side surface section of the electronic component accommodating section and is joined to the cooling plate via a joint material on the three sides, in that the electronic component is arranged such that a side surface section thereof is in contact with an inner side of the electronic component accommodating section via a filler.

2. The cooling apparatus according to claim 1 wherein the electronic component accommodating section is configured to surround the side surface section and a bottom surface section of the electronic component and close the opening of the cooling plate.

3. The cooling apparatus according to claim 1 wherein the electronic component accommodating section is constructed of a cylindrical member that surrounds the side surface section of the electronic component.

4. The cooling apparatus according to claim 1, wherein the cooling pipeline is joined to the outer side surface section of the electronic component accommodating section.

5. The cooling apparatus according to claim 1, wherein the cooling plate and the electronic component accommodating section have an integrated structure.

6. The cooling apparatus according to claim 1, comprising:
   a joined section between the cooling plate and the electronic component accommodating section is formed in a shape that is along an exterior surface of the cooling pipeline.

7. The cooling apparatus according to claim 1, wherein the cooling pipeline is constructed of a pipe having an oval cross-section.

8. The cooling apparatus according to claim 1, wherein the cooling pipeline is constructed of pipe having a rectangular cross-section.

9. The cooling apparatus according to claim 1, wherein the cooling pipeline is constructed of a metal plate that is adhered to the cooling plate and forms a flow path of a cooling medium and couplers that are joined to ends of the flow path.

10. The cooling apparatus according to claim 1, wherein the electronic component in a state of being mounted on a base plate is arranged in the electronic component accommodating section, and the base plate is joined to the cooling plate.

11. The cooling apparatus according to claim 3 wherein the cooling pipeline is constructed of a metal plate that is adhered to the cooling plate and forms a flow path of a cooling medium and couplers that are joined to ends of the flow path, the electronic component, in a state of being mounted on a base plate, is arranged in the electronic component accommodating section, and the base plate is joined to the cooling plate, and elements for constituting a thickness of the cooling apparatus are the base plate, the electronic component, the filler, and the metal plate.

12. A cooling apparatus, comprising:
   an electronic component;
   a cooling plate for cooling the electronic component;
   an electronic component accommodating section that is attached to a periphery of an opening formed in the cooling plate and accommodates the electronic component therein; and
   a cooling pipeline that is disposed in a manner to surround an outer side surface section of the electronic component accommodating section and is joined to the cooling plate, in that the electronic component is arranged such that a side surface section thereof is in contact with an inner side of the electronic component accommodating section via a filler, wherein the cooling pipeline is constructed of a metal plate that is adhered to the cooling plate and forms a flow path of a cooling medium and couplers that are joined to ends of the flow path.

13. A cooling apparatus, comprising:
   an electronic component;
   a cooling plate for cooling the electronic component;
   an electronic component accommodating section that is attached to a periphery of an opening formed in the cooling plate and accommodates the electronic component therein; and
   a cooling pipeline that is disposed in a manner to surround an outer side surface section of the electronic component accommodating section and is joined to the cooling plate, in that the electronic component is arranged such that a side surface section thereof is in contact with an inner side of the electronic component accommodating section via a filler, wherein the electronic component accommodating section is constructed of a cylindrical member that surrounds the side surface section of the electronic component, wherein the cooling pipeline is constructed of a metal plate that is adhered to the cooling plate and forms a flow path of a cooling medium and couplers that are joined to ends of the flow path, the electronic component, in a state of being mounted on a base plate, is arranged in the electronic component accommodating section, and the base plate is joined to the cooling plate, and elements for constituting a thickness of the cooling apparatus are the base plate, the electronic component, the filler, and the metal plate.

\* \* \* \* \*